(12) United States Patent
Tanaka et al.

(10) Patent No.: US 11,843,009 B2
(45) Date of Patent: Dec. 12, 2023

(54) PHOTOSENSITIVE ASSEMBLY, IMAGING MODULE, SMART TERMINAL, AND METHOD AND MOULD FOR MANUFACTURING PHOTOSENSITIVE ASSEMBLY

(71) Applicant: NINGBO SUNNY OPOTECH CO., LTD., Yuyao (CN)

(72) Inventors: Takehiko Tanaka, Yuyao (CN); Zhenyu Chen, Yuyao (CN); Zhewen Mei, Yuyao (CN)

(73) Assignee: NINGBO SUNNY OPOTECH CO., LTD., Yuyao (CN)

( * ) Notice: Subject to any disclaimer, the term of this patent is extended or adjusted under 35 U.S.C. 154(b) by 765 days.

(21) Appl. No.: 16/637,895

(22) PCT Filed: Aug. 8, 2018

(86) PCT No.: PCT/CN2018/099271
§ 371 (c)(1),
(2) Date: Feb. 10, 2020

(87) PCT Pub. No.: WO2019/033961
PCT Pub. Date: Feb. 21, 2019

(65) Prior Publication Data
US 2020/0219919 A1   Jul. 9, 2020

(30) Foreign Application Priority Data

Aug. 18, 2017 (CN) .......................... 201710712589.1
Aug. 18, 2017 (CN) .......................... 201721042380.0

(51) Int. Cl.
*H01L 27/146* (2006.01)
*B29C 45/14* (2006.01)
(Continued)

(52) U.S. Cl.
CPC .. *H01L 27/14618* (2013.01); *B29C 45/14336* (2013.01); *B29C 45/37* (2013.01);
(Continued)

(58) Field of Classification Search
CPC .......... H01L 27/14618; H01L 23/3185; H04N 23/55
See application file for complete search history.

(56) References Cited

U.S. PATENT DOCUMENTS 7,547,962 B2 * 6/2009 Weng ................ H01L 27/14618
257/784
7,906,859 B2 * 3/2011 Yoshioka ............ H01L 23/3142
257/E23.117

(Continued)

FOREIGN PATENT DOCUMENTS

CN        101221930 A    7/2008
CN        103358649 A    10/2013
(Continued)

OTHER PUBLICATIONS

International Search Report, issued in PCT/CN2018/099271, dated Oct. 24, 2018.
(Continued)

*Primary Examiner* — David A Zarneke
(74) *Attorney, Agent, or Firm* — Birch, Stewart, Kolasch & Birch, LLP

(57) ABSTRACT

Disclosed a photosensitive assembly, an imaging module, a smart terminal, and a method and a mould for manufacturing the photosensitive assembly. The photosensitive assembly comprises: a circuit board having a rectangular-shaped rigid board region and comprising a flexible board extension portion extending from the rigid board region, wherein the rigid board region has a lamination side and a non-lamination side, and the rigid board region has a lamination region
(Continued)

on the lamination side; a photosensitive element mounted in the rigid board region of the circuit board; and a molded portion formed on the rigid board region, surrounding the photosensitive element, and extending towards the photosensitive element and coming into contact with the photosensitive element, the molded portion having an inner side surface, an outer side surface and a top surface, the molded portion not covering the lamination region of the rigid board region, and the top surface having a flat portion, wherein the top surface of a part of the molded portion on the lamination side has a descending portion, the descending portion is located between the flat portion and the outer side surface of the molded portion and is lower than the flat portion, and the outer side surface of a part of the molded portion on the non-lamination side is perpendicular to the flat portion.

12 Claims, 17 Drawing Sheets

(51) Int. Cl.
    *B29C 45/37*     (2006.01)
    *H04N 23/55*     (2023.01)
    *B29L 11/00*     (2006.01)

(52) U.S. Cl.
    CPC .. *H01L 27/14627* (2013.01); *H01L 27/14683* (2013.01); *H04N 23/55* (2023.01); *B29C 2793/009* (2013.01); *B29L 2011/00* (2013.01)

(56) References Cited

U.S. PATENT DOCUMENTS

| | | | | |
|---|---|---|---|---|
| 8,274,125 B2 * | 9/2012 | Furuyashiki | ............ | H01L 24/48 |
| | | | | 257/433 |
| 8,957,489 B2 * | 2/2015 | Angerer | .............. | H01L 23/3185 |
| | | | | 257/E23.116 |
| 10,044,917 B2 * | 8/2018 | Otani | ...................... | H04N 23/54 |
| 10,321,028 B2 * | 6/2019 | Wang | ...................... | H04N 23/57 |
| 2008/0061313 A1 * | 3/2008 | Yen | .......................... | H01L 33/54 |
| | | | | 257/E33.059 |
| 2008/0099864 A1 * | 5/2008 | Wu | .................... | H01L 27/14618 |
| | | | | 257/E31.118 |
| 2012/0217606 A1 | 8/2012 | Itonaga | | |
| 2014/0346627 A1 | 11/2014 | Yamada et al. | | |
| 2015/0048240 A1 | 2/2015 | Hori | | |
| 2016/0150133 A1 * | 5/2016 | Suzuki | ................... | H04N 23/51 |
| | | | | 348/376 |
| 2016/0191767 A1 * | 6/2016 | Otani | ....................... | G02B 7/08 |
| | | | | 29/832 |
| 2017/0147857 A1 * | 5/2017 | Liu | .......................... | H01L 24/46 |

FOREIGN PATENT DOCUMENTS

| | | |
|---|---|---|
| CN | 103959466 A | 7/2014 |
| CN | 104425528 A | 3/2015 |
| CN | 105100569 A | 11/2015 |
| CN | 105262936 A | 1/2016 |
| CN | 105474616 A | 4/2016 |
| CN | 205961279 U | 2/2017 |
| CN | 206302476 U | 7/2017 |
| CN | 207410417 U | 5/2018 |
| CN | 208093560 U | 11/2018 |
| JP | 2015-38920 A | 2/2015 |
| JP | 2016-100573 A | 5/2016 |
| WO | WO 2004/040659 A1 | 5/2004 |

OTHER PUBLICATIONS

Extended European Search Report, dated Aug. 12, 2020, for European Application No. 18845725.3.
Partial Supplementary European Search Report, dated May 29, 2020, for European Application No. 18845725.3.
European Office Action for European Application No. 18 845 725.3 dated May 10, 2021.

* cited by examiner

PHOTOSENSITIVE ASSEMBLY, IMAGING MODULE, SMART TERMINAL, AND METHOD AND MOULD FOR MANUFACTURING PHOTOSENSITIVE ASSEMBLY

CROSS-REFERENCE TO RELATED APPLICATIONS

The present application claims the priority and benefit of Chinese Patent Applications Nos. 201710712589.1 and 201721042380.0, filed with the State Intellectual Property Office of China on Aug. 18, 2017, the entire contents of which are incorporated herein by reference.

TECHNICAL FIELD

The present disclosure relates to the technical field of imaging assemblies and smart terminals, and in particular, to a photosensitive assembly, an imaging module, a smart terminal, and a method and a mould for manufacturing a photosensitive assembly.

BACKGROUND

Molded camera modules are a very popular high-tech in the current market. Instead of an ordinary lens holder, a photosensitive chip, a connecting medium and an electronic component of a camera module are encapsulated and fixed on a circuit board by molding, obtaining good impact stability and thermal stability. At the same time, the upper surface of the molding structure is very flat, which can improve the tilt accuracy of mounting a lens or motor above the chip. However, the flat upper surface also brings new problems. The lens or motor above the molding structure still needs to apply glue and the glue is cured by drastic changes in the external environment such as exposure or heating. On the one hand, the glue has certain fluidity. When a component such as a lens or motor is installed after the glue is applied, the glue at the bottom of the component will overflow in all directions under pressure. At the same time, the glue to be applied needs to be in a closed loop. Since an upper edge of a conventional molded portion is completely flat, only the sloping or vertical edge of the draft cannot accommodate a large amount of glue that overflows from the starting point of the glue, and the excess glue will overflow to the side of the module and protrude outward, making the size of the module beyond the design scope, and affecting installation and use.

In addition, with the miniaturization design of the camera module, the flat surface for mounting optical assemblies in the molded portion has become smaller and smaller. At the same time, because the lens or motor has a high requirement for mounting tilt accuracy, how to maintain miniaturization of the camera module while providing a mounting plane as large as possible on the molded portion is also an issue that needs to be solved urgently.

SUMMARY

According to an aspect of the present disclosure, there is provided a photosensitive assembly, wherein it comprises: a circuit board having a rectangular-shaped rigid board region and comprising a flexible board extension portion extending from the rigid board region, wherein the rigid board region has a lamination side and a non-lamination side, the rigid board region has a lamination region on the lamination side, and the flexible board extension portion extends out from the lamination side; a photosensitive element mounted in the rigid board region of the circuit board; and a molded portion formed on the rigid board region, surrounding the photosensitive element, and extending towards the photosensitive element and coming into contact with the photosensitive element, wherein the molded portion has an inner side surface, an outer side surface and a top surface, the molded portion does not cover the lamination region of the rigid board region, and the top surface has a flat portion, wherein the top surface of a part of the molded portion on the lamination side has a descending portion, the descending portion is located between the flat portion and the outer side surface of the molded portion and is lower than the flat portion, and the outer side surface of a part of the molded portion on the non-lamination side is perpendicular to the flat portion.

The descending portion, in a first section therethrough, has a contour of a first arc shape, wherein the first section is in a plane perpendicular to an edge of the rigid board region on the lamination side.

The molded portion comprises a connecting portion connecting the inner side surface and the flat portion.

The connecting portion, in a second section therethrough, has a contour of a second arc shape, wherein the second section is in a plane perpendicular to the flat portion adjacent to the connecting portion and the inner side surface, and a length of the first arc shape is greater than a length of the second arc shape.

The connecting portion, in a second section therethrough, has a contour of a second arc shape, wherein the second section is in a plane perpendicular to the flat portion adjacent to the connecting portion and the inner side surface, and a radius of curvature of the first arc shape is greater than a radius of curvature of the second arc shape.

The top surface of the molded portion has a recessed portion adjacent to the connecting portion, and the recessed portion, in a third section therethrough, has a contour of a right angle shape, and the right angle shape has a side parallel to the flat portion of the molded portion, wherein the third section is in a plane perpendicular to the inner side surface and the top surface of the molded portion.

An outer side surface of the molded portion has a recessed portion adjacent to the descending portion, and the recessed portion, in a third section therethrough, has a contour of an arc shape, a right angle shape, or an oblique line shape, wherein the third section is in a plane perpendicular to an edge of the rigid board region on the lamination side.

The molded portion has an opening exposing the photosensitive element.

The inner side surface of the molded portion is at an obtuse angle with a top surface of the photosensitive element.

The inner side surface of the molded portion is directly connected to a top surface of the photosensitive element.

According to another aspect of the present disclosure, there is provided an imaging module, wherein it comprises the photosensitive assembly described above and an optical assembly mounted on the photosensitive assembly.

The optical assembly is connected to the top surface of the molded portion by an adhesive, wherein the adhesive is present on the descending portion.

The optical assembly comprises a filter assembly, a lens assembly, and a driving element.

The optical assembly comprises a lens assembly, and the lens assembly is connected to the flat portion of the top surface of the molded portion by an adhesive.

According to another aspect of the present disclosure, there is provided a smart terminal, comprising the imaging module described above.

According to another aspect of the present disclosure, there is provided a method for manufacturing a photosensitive assembly, wherein it comprises: mounting a plurality of photosensitive elements on a plurality of circuit boards in a CB-jointed panel ("CB"="Circuit Board"), respectively, wherein the plurality of circuit boards are arranged in an array and comprise rigid board regions, the rigid board region has a lamination side and a non-lamination side, and the rigid board region has a lamination region on the lamination side; attaching a flexible film to a mould, wherein the mould has a plurality of indenters arranged in an array and a cavity-shaped portion surrounding the plurality of indenters, the respective cavity-shaped portion has a side surface and a flat top surface, and the side surface and the top surface form an open space with the indenters; pressing the mould attached with the flexible film onto the CB-jointed panel mounted with the photosensitive elements, so that each of the indenters is separately aligned with each of the plurality of photosensitive elements, and the flexible film is in contact with the lamination region of each of the rigid board regions; injecting a molding material into a space defined by the mould attached with the flexible film and the CB-jointed panel mounted with the plurality of photosensitive elements to form a molded portion, the molded portion having a shape corresponding to the space; removing the mould with the flexible film; and cutting the molded portion at at least two non-lamination sides of each of the circuit boards and the respective circuit board along a direction perpendicular to a top surface of the CB-jointed panel, so as to form the photosensitive assembly.

The attaching the flexible film to the mould comprises: attaching the flexible film to the mould by evacuating gas between the flexible film and the mould.

The mould has a protruded portion at an intersection between the top surface and the side surface of the cavity-shaped portion.

The protruded portion, in a first section therethrough, has a contour of an arc shape, an oblique line shape, or a right angle shape, wherein the first section is in a plane perpendicular to an edge of a corresponding one of the rigid board regions on the lamination side.

In the mould, the top surface of the cavity-shaped portion comprises a protruded portion closest to the respective indenter.

The protruded portion has a bottom surface and a side surface, wherein the bottom surface is parallel to the top surface of the cavity-shaped portion.

A side surface of the indenter forms an obtuse angle with the top surface of the cavity-shaped portion.

According to another aspect of the present disclosure, there is provided a molding mould, wherein it comprises a plurality of indenters arranged in an array and a cavity-shaped portion surrounding the plurality of indenters, wherein the respective cavity-shaped portion has a side surface and a flat top surface, and the side surface and the top surface form an open space with the indenters.

The molding mould has a protruded portion at an intersection between the top surface and the side surface of the cavity-shaped portion.

The protruded portion, in a first section therethrough, has a contour of an arc shape, an oblique line shape, or a right angle shape, wherein the first section is in a plane perpendicular to the top surface and the side surface of the cavity-shaped portion.

The top surface of the cavity-shaped portion comprises a protruded portion closest to the respective indenter.

The protruded portion has a bottom surface and a side surface, wherein the bottom surface is parallel to the top surface of the cavity-shaped portion.

A side surface of the indenter forms an obtuse angle with the top surface of the cavity-shaped portion.

The photosensitive assembly provided by the present disclosure and the photosensitive assembly manufactured by using the method of the present disclosure can provide a relatively large glue overflow space so that the photosensitive assembly has a stable external size, and provide a flat top surface as large as possible in the molded portion while providing the glue overflow space. The flat top surface can facilitate automatic alignment of components mounted above it, and enhance the lateral bonding strength of the components mounted above it.

BRIEF DESCRIPTION OF THE DRAWINGS

Exemplary embodiments are shown in the accompanying drawings. The embodiments and accompanying drawings disclosed herein are to be considered illustrative and not restrictive. In the accompanying drawings.

DETAILED DESCRIPTION

Figure 1:
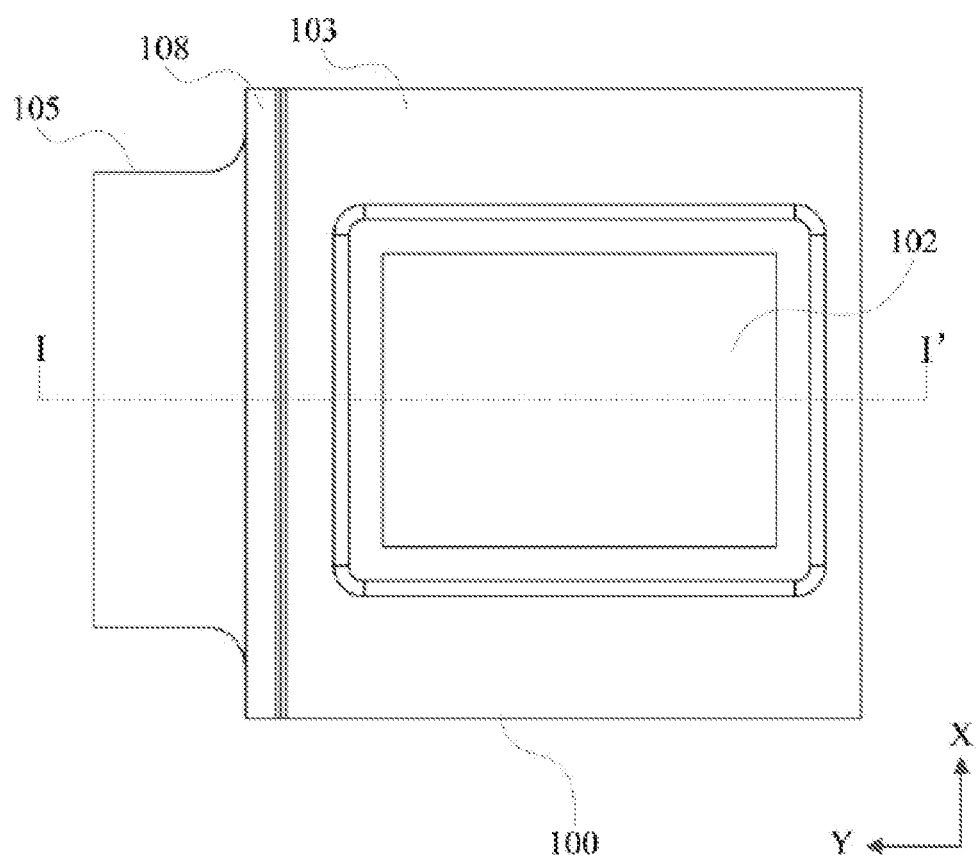
FIG. 1 is a top view of a photosensitive assembly according to an embodiment of the present disclosure.

In order to better understand the present application, various aspects of the present application will be described in more detail with reference to the accompanying drawings. It should be understood that the detailed description is merely description of exemplary embodiments of the present application, and does not limit the scope of the present application in any way. Throughout the description, the same reference numerals refer to the same elements. The expression "and/or" includes any and all combinations of one or more of the associated listed items.

It should be noted that in the present description, the expressions of "first", "second", etc. are only used to distinguish one feature from another feature, and do not indicate any limitation on the feature. Therefore, without departing from the teachings of the present application, a first main body discussed below may also be referred to as a second main body.

In the accompanying drawings, for convenience of explanation, the thickness, size, and shape of the object have been slightly exaggerated. The accompanying drawings are only examples and are not drawn to scale.

It should also be understood that the terms "comprising", "comprise", "having", "including" and/or "include" when used in the present description, indicate the existence of stated features, wholeness, steps, operations, elements and/or components, but does not exclude the presence or addition of one or more other features, wholes, steps, operations, elements, components and/or combinations thereof. Furthermore, when an expression such as "at least one of" appears after the list of listed features, it modifies the entire listed features, rather than a single element in the list. In addition, when describing an embodiment of the present application, "may"/"can" is used to denote "one or more embodiments of the present application." Also, the term "exemplary" is intended to refer to an example or illustration. When an element or layer is referred to as being "on", "connected to" or "coupled to" another element or layer, it can be directly located on, be directly connected to or be directly coupled to another element or layer, or intermediate elements or layers may be present. However, when an element or layer is referred to as being "directly on", "directly connected to" or "directly coupled to" another element or layer, no intermediate elements or layers are present.

As used herein, the terms "substantially", "approximately" and similar terms are used as a term expressing an approximation and not as a term expressing an extent, and are intended to indicate an inherent deviation in a measurement value or calculated value, which will be recognized by an ordinary person skilled in the art.

Spatially relative terms such as "under", "below", "lower", "above", "upper", etc. may be used herein for descriptive purposes, and thus may be used to describe a relationship of an element or feature shown in the accompanying drawings with another element (multiple elements) or feature (multiple features). In addition to the orientation shown in the accompanying drawings, spatially relative terms are intended to include different orientations of a device in use, operation, and/or manufacturing. For example, if the device in the accompanying drawings is turned over, elements described as "under" or "below" other elements or features would then be oriented "above" the other elements or features. Thus, the exemplary term "below" may include both orientations of above and below. Furthermore, the device may be oriented in other ways (e.g., being rotated by 90 degrees or at other orientations), and thus spatially relative descriptors used herein are interpreted accordingly.

Unless otherwise defined, all terms (including technical and scientific terms) used herein have the same meanings as commonly understood by an ordinary person skilled in the art to which the present application belongs. It should also be understood that the terms (such as those defined in commonly used dictionaries) should be interpreted to have meanings consistent with their meaning in the context of the relevant art and will not be interpreted in an idealized or overly formal sense unless it is clearly defined herein.

It should be noted that, in the case of no conflict, the embodiments in the present application and the features in the embodiments can be combined with each other. The present application will be described in detail below in conjunction with embodiments with reference to the accompanying drawings.

Figure 2:
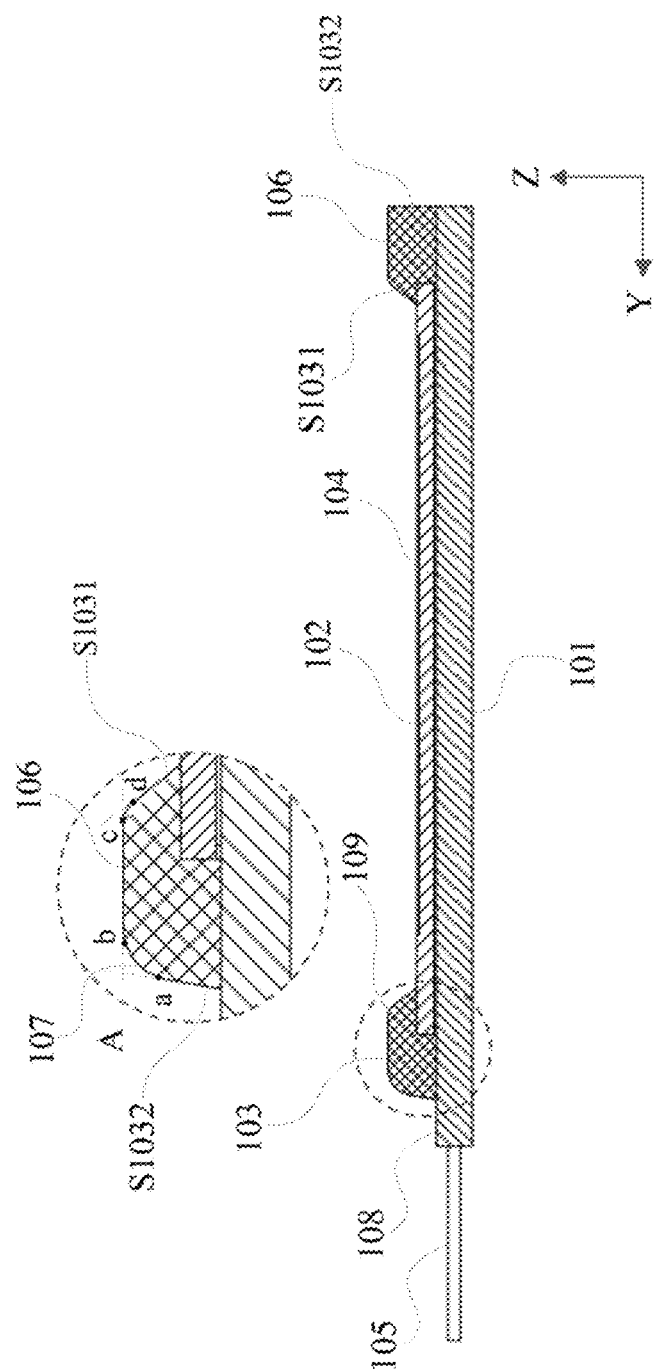
FIG. 2 is a sectional view of the photosensitive assembly taken along a line I-I' in FIG. 1 according to the embodiment of the present disclosure.
Figure 3:
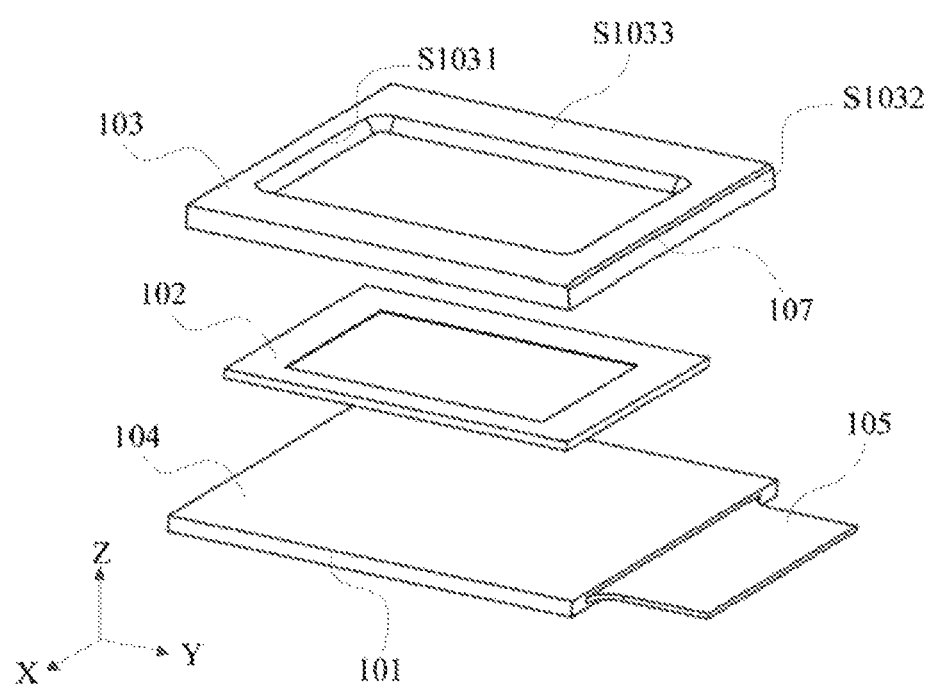
FIG. 3 shows an exploded perspective view of the photosensitive assembly according to the embodiment of the present disclosure.

FIG. 1 shows a top view of a photosensitive assembly according to an embodiment of the present disclosure, FIG. 2 shows a sectional view of the photosensitive assembly taken along a line I-I' in FIG. 1 according to the embodiment of the present disclosure, and FIG. 3 shows an exploded perspective view of the photosensitive assembly in FIG. 1 according to the embodiment of the present disclosure. Referring to FIGS. 1-3, the photosensitive assembly 100 includes a circuit board 101, a photosensitive element 102, and a molded portion 103.

The circuit board 101 may have a multilayer structure, for example, a multilayer structure stacked in an order of a rigid board, a flexible board, and a rigid board, but the present disclosure is not limited thereto. As shown in FIG. 3, the circuit board 101 includes a rectangular rigid board region 104 and a flexible board extension portion 105 extending from one side of the rigid board region 104. A side to which the flexible board extension portion 105 is connected may be referred to as a flexible board side, the flexible board extension portion 105 extends along a Y-axis direction, and the flexible board side of the rigid board region 104 extends along an X axis. In addition, the other side of the rigid board region 104 that is not connected to the flexible board extension portion 105 may be referred to as a non-flexible board side. Further, as shown in FIGS. 1 and 2, the circuit board 101 has a lamination region 108 on the flexible board side of the rigid board region 104, and the lamination region 108 is located on the flexible board side of the circuit board 101 and is not covered by the molded portion 103.

The photosensitive element 102 may be mounted on the circuit board 101, for example, may be mounted at a central position of the rigid board region 104, but the present disclosure is not limited thereto. The photosensitive element 102 can be used to convert light into an electrical signal.

Referring to FIGS. 1 and 2, the molded portion 103 may be formed on the rigid board region 104 to surround the photosensitive element 102 and extend towards and come into contact with the photosensitive element 102. In addition, the molded portion 103 has an inner side surface S1031, an outer side surface S1032, and a top surface S1033 (refer to FIG. 3), and the molded portion 103 does not cover the lamination region 108. Also, the top surface S1033 has a flat portion 106, the flat portion 106 is a flat part in the top surface S1033 of the molded portion 103, and this part is used to mount an assembly having high requirements on stability and flatness of the mounting plane, such as a lens assembly or a filter assembly. Although only the flat portion 106 on a part of the molded portion 103 extending along the X-axis direction is shown in FIG. 2, the flat portion 106 may be present on the top surface S1033 of the molded portion 103 located around the photosensitive element 102. In addition, the inner side surface S1031 and the outer side surface S1032 of the molded portion 103 surround the photosensitive element 102.

Referring to FIG. 2, the top surface S1033 of a part of the molded portion 103 on the lamination side has a descending portion 107, and the descending portion 107 is located between the flat portion 106 of the top surface S1033 and the outer side surface S1032 and is lower than the flat portion 106. The enlarged view A of FIG. 2 shows an enlarged view of the descending portion 107, and the descending portion 107 may be a part between points a and b, wherein point a is a position where an extension plane (denoted by a dotted line inclined relative to a Z axis) of the outer side surface S1032 intersects with the molded portion 103, and point b is a position where an extension plane of the flat portion 106 (denoted by a dotted line parallel to the Y axis in part A of FIG. 2) intersects with the molded portion 103. Since the descending portion 107 is lower than the flat portion 106, when the optical assembly is mounted on the molded portion 103 by an adhesive, the descending portion 107 can accommodate the adhesive overflowing between the flat portion 106 and the optical assembly to function as a glue overflow groove. The descending portion 107 can provide a relatively large glue overflow space, so that the photosensitive assembly 100 can have a stable external size.

As shown in FIGS. 1 and 3, the molded portion 103 may have a homocentric square shape, and the molded portion 103 has an opening in the middle to expose the photosensitive element 102. In a part of the molded portion 103 on the non-lamination side, the molded portion 103 may not have the descending portion 107, and the outer side surface S1032 of the molded portion 103 is perpendicular to the flat portion 106. As shown in FIG. 2, in a part of the molded portion 103 farthest from the lamination region 108 in the Y direction, the outer side surface S1032 of the molded portion 103 is perpendicular to the flat portion 106. In some embodiments, in a part of the molded portion 103 corresponding to at least two of the non-lamination sides, the outer side surface S1032 of the molded portion 103 may be perpendicular to the flat portion 106. This arrangement can provide a flat top surface as large as possible while having a descending portion in a part of the top surface to accommodate the overflown glue.

FIG. 2 shows a sectional view of the photosensitive assembly taken along the line I-I' in FIG. 1 according to the embodiment of the present disclosure. The line I-I' extends along the Y direction and is perpendicular to an edge of the rigid board region 104 on the lamination side. In some embodiments, as shown in FIG. 2, a contour of the descending portion 107 may have a first arc shape, and the first arc shape may have a first length, i.e. an arc length from point a to point b.

Further, as shown in FIG. 2, there is a connecting portion 109 connecting the flat portion 106 and the inner side surface S1031 of the molded portion 103 between the two. As described above, the flat portion 106 and the inner side surface S1031 surround the photosensitive element 102, and thus the connecting portion 109 may also surround the photosensitive element 102. As shown the enlarged view A in FIG. 2, the connecting portion 109 may be a part between point c and point d, wherein point c is a position where the extension plane of the flat portion 106 intersects with the molded portion 103, and point d is a position where the extension plane of the inner side surface S1031 intersects with the molded portion 103. In the sectional view of FIG. 2, the connecting portion 109 has a second arc shape, and the second arc shape has a second length, i.e. an arc length from point c to point d.

In addition, the descending portion 107 may have a first radius of curvature, and the connecting portion 109 may have a second radius of curvature.

In some embodiments, the first arc length may be greater than the second arc length, or the first radius of curvature may be greater than the second radius of curvature. The first arc shape and the second arc shape may be a part of a circle or have a varying radius of curvature. When the first arc shape or the second arc shape has a varying radius of curvature due to manufacturing processes and errors, etc., the first radius of curvature or the second radius of curvature may be an average radius of curvature.

When the first arc length is greater than the second arc length or the first radius of curvature is greater than the second radius of curvature, a surface of the molded portion 103 composed of the descending portion 107, the flat portion 106, and the connecting portion 109 together makes the fluid thereon more inclined to flow towards the descending portion 107, because the descending portion 107 has a larger radius of curvature and a longer length, the tension of the fluid at the descending portion 107 is smaller, and it tends to flow towards the descending portion 107.

Figure 4:
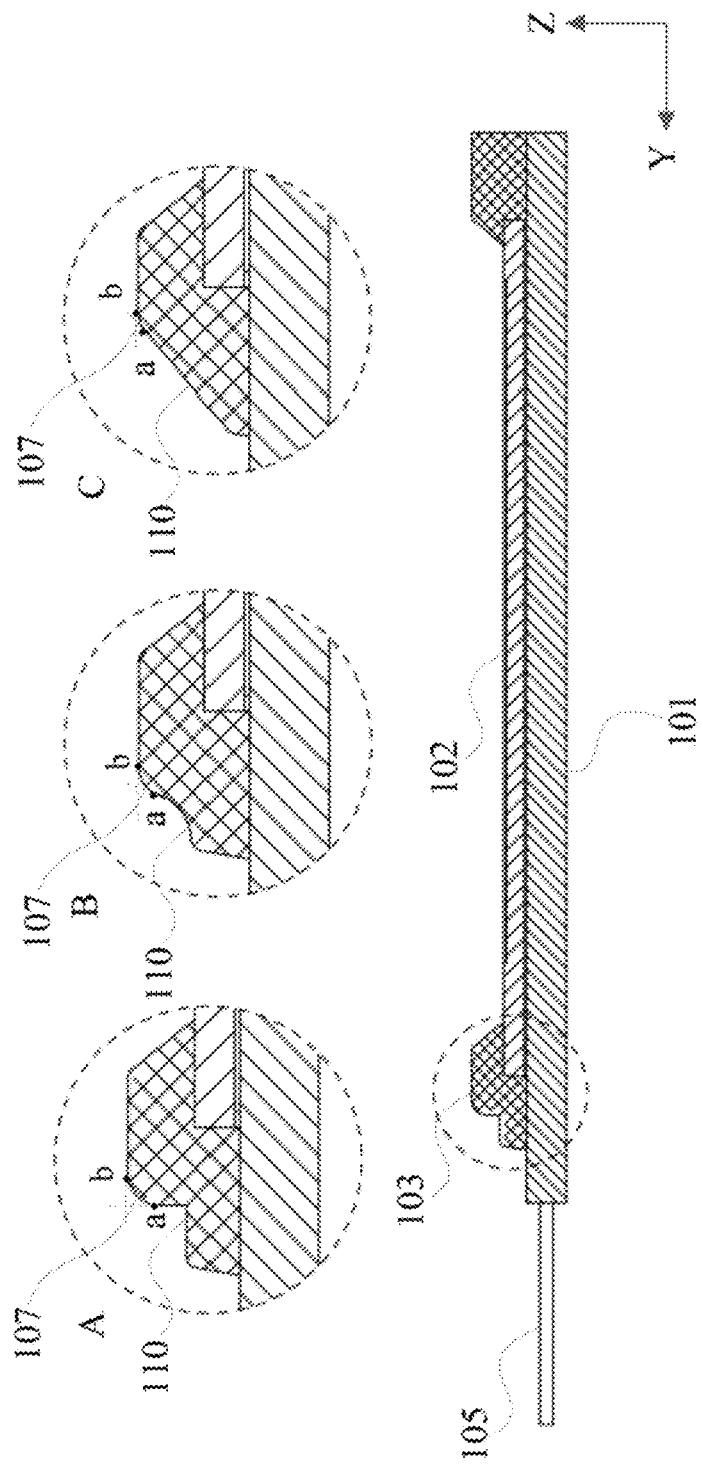
FIG. 4 shows a sectional view of a photosensitive assembly taken along the line I-I' in FIG. 1 according to an exemplary embodiment of the present disclosure.

FIG. 4 shows a sectional view of a photosensitive assembly taken along the line I-I' in FIG. 1 according to an exemplary embodiment of the present disclosure.

Referring to FIGS. 2 to 4, the outer side surface S1032 of the molded portion 103 may have a recessed portion 110 adjacent to the descending portion 107. The enlarged views A-C in FIG. 4 each show three embodiments of the recessed portion 110. As shown in FIG. 4, the sectional contour of the recessed portion 110 may have a right angle shape, an arc shape, or an oblique line shape. The outer side surface S1032 of the molded portion 103 further includes a recessed portion 110 to enable a larger glue overflow space provided so as to better accommodate the adhesive flowing out between the molded portion 103 and the optical element mounted thereon during the manufacturing process.

Figure 5:
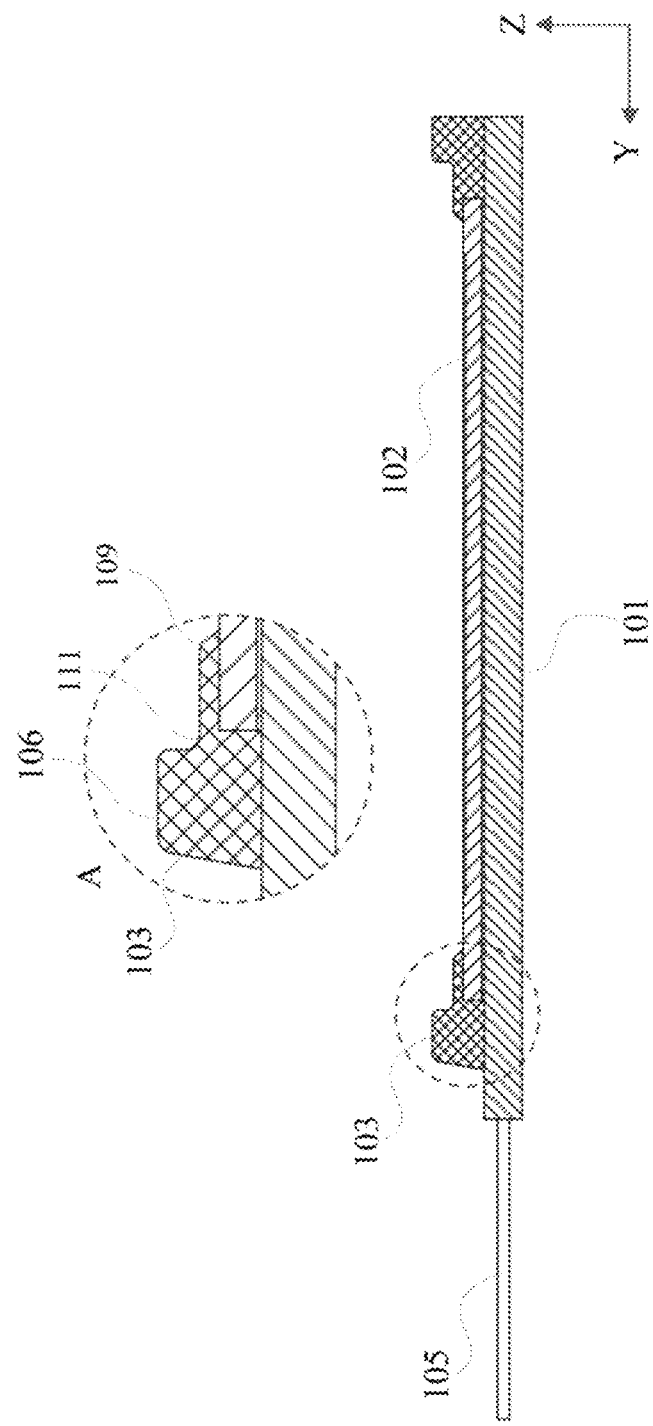
FIG. 5 shows a sectional view of a photosensitive assembly taken along the line I-I' in FIG. 1 according to an exemplary embodiment of the present disclosure.

FIG. 5 shows a sectional view of a photosensitive assembly taken along the line I-I' in FIG. 1 according to an exemplary embodiment of the present disclosure, wherein the enlarged view A in FIG. 5 corresponds to a part shown by a dotted circle in a lower sectional view of FIG. 5. Referring to FIG. 5, the top surface S1033 of the molded portion 103 has a recessed portion 111 adjacent to the connecting portion 109. The sectional contour of the recessed portion 111 may have a right angle shape, and the right angle shape has a side parallel to the flat portion 106 of the molded portion 103. That is, the recessed portion 111 has a platform parallel to the flat portion 106, and the platform is used for mounting an optical element having high requirements of flatness and stability, such as a filter assembly.

Referring again to FIG. 2, in some embodiments, the inner side surface S1031 of the molded portion 103 may be at an obtuse angle with the top surface of the photosensitive element 102. Thus, the inner side surface S1031 of the molded portion 103 may direct light incident thereon to reflect towards a direction away from the photosensitive element 102, so that the stray light incident on the photosensitive element 102 can be effectively reduced. In addition, in some embodiments, the inner side surface S1031 of the molded portion 103 may be directly connected to the top surface of the photosensitive element 102. In this case, since there are no intermediate elements between the inner side surface S1031 of the molded portion 103 and the top surface of the photosensitive element 102, the thickness and volume of the photosensitive assembly 100 can be reduced.

Figure 6:
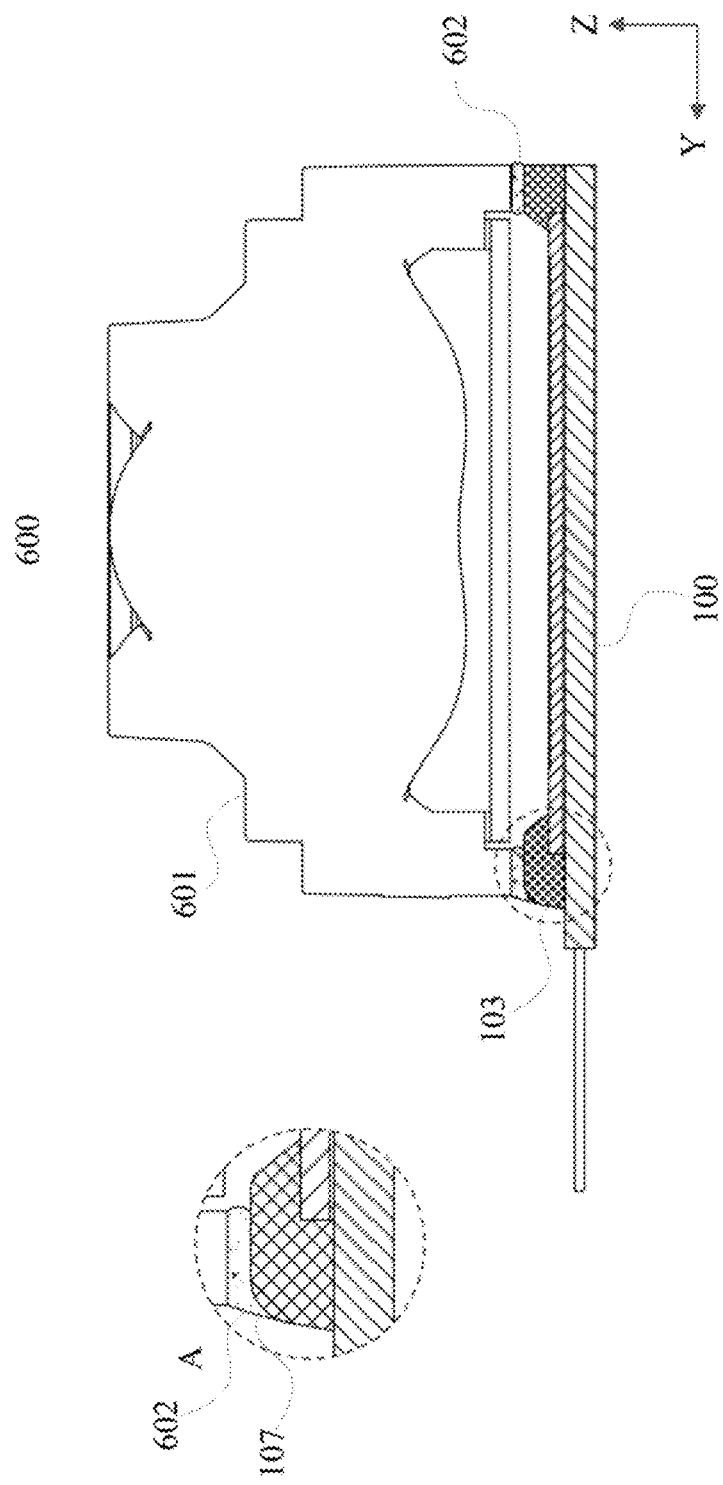
FIG. 6 shows an imaging module according to an embodiment of the present disclosure.

FIG. 6 shows an imaging module according to an embodiment of the present disclosure. Referring to FIG. 6, the imaging module 600 includes the photosensitive assembly 100 described with reference to FIGS. 1 to 5 and an optical assembly 601 mounted on the photosensitive assembly 100. The optical assembly 601 is connected to the top surface of the molded portion 103 of the photosensitive assembly 100 by an adhesive 602, wherein the optical assembly 601 may be a filter assembly, a lens assembly, a driving element such as a motor, and the like. The enlarged view A in FIG. 6 corresponds to a part shown by a dotted circle in the right part of FIG. 6. Referring to the enlarged view A in FIG. 6, the adhesive 602 may be present on the descending portion 107 of the molded portion 103 due to the function of the glue overflow groove of the descending portion 107. When the optical assembly 601 is a lens assembly, the optical assembly 601 is connected to the flat portion of the molded portion 103 by the adhesive 602 because the lens assembly requires a higher flatness of the mounting plane. As shown in FIG. 6, since the outer side surface of the molded portion on the non-lamination side is perpendicular to the flat portion, the mounting area for the lens assembly is increased, and the mounting plane of the lens assembly can be fully carried.

The above imaging module 600 may be used in a smart terminal, for example, a smart phone, a tablet computer, and a wearable device such as a smart watch, and the like, but the present disclosure is not limited thereto. For example, when the smart terminal is a smart phone, the imaging module 600 may be included in a camera of the smart phone.

Before explaining a method for manufacturing the photosensitive assembly 100 in detail, a molding mould 700 used in the method will be first described.

Figure 7:
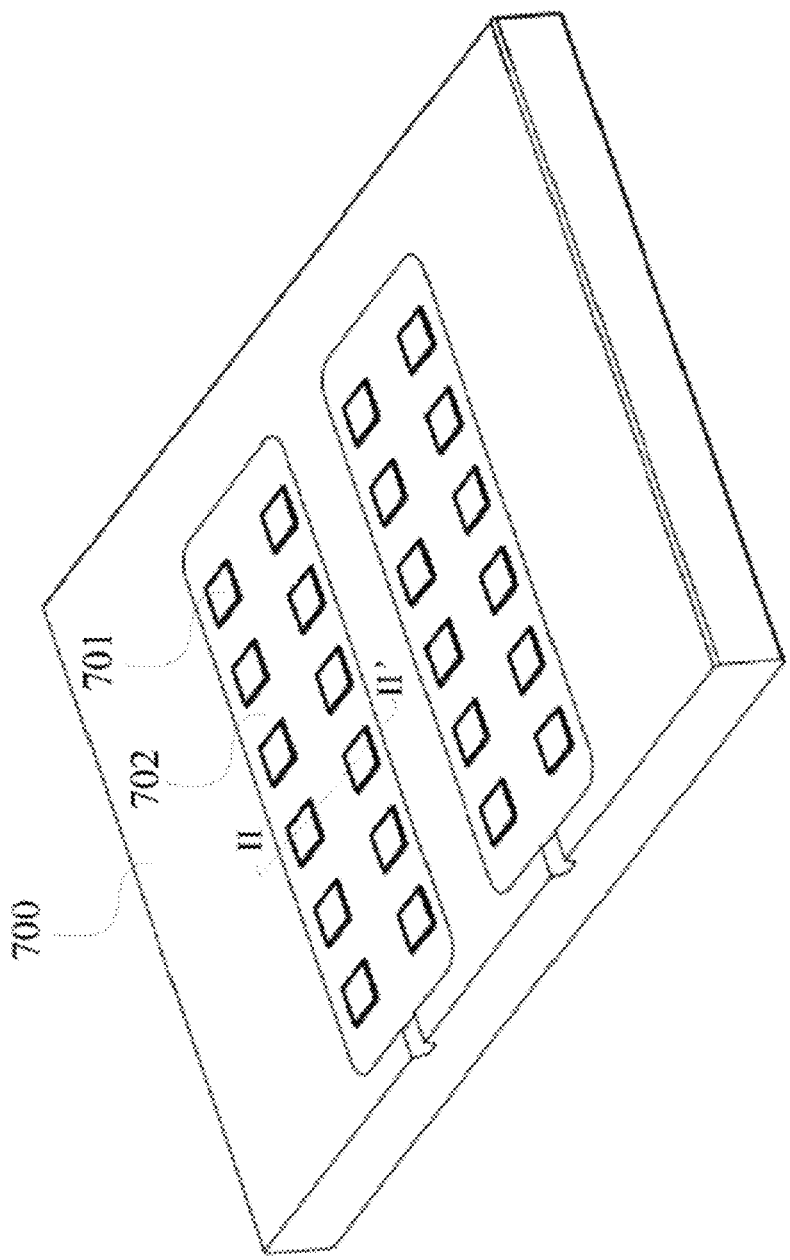
FIG. 7 shows a perspective view of a molding mould according to an embodiment of the present disclosure.
Figure 8:
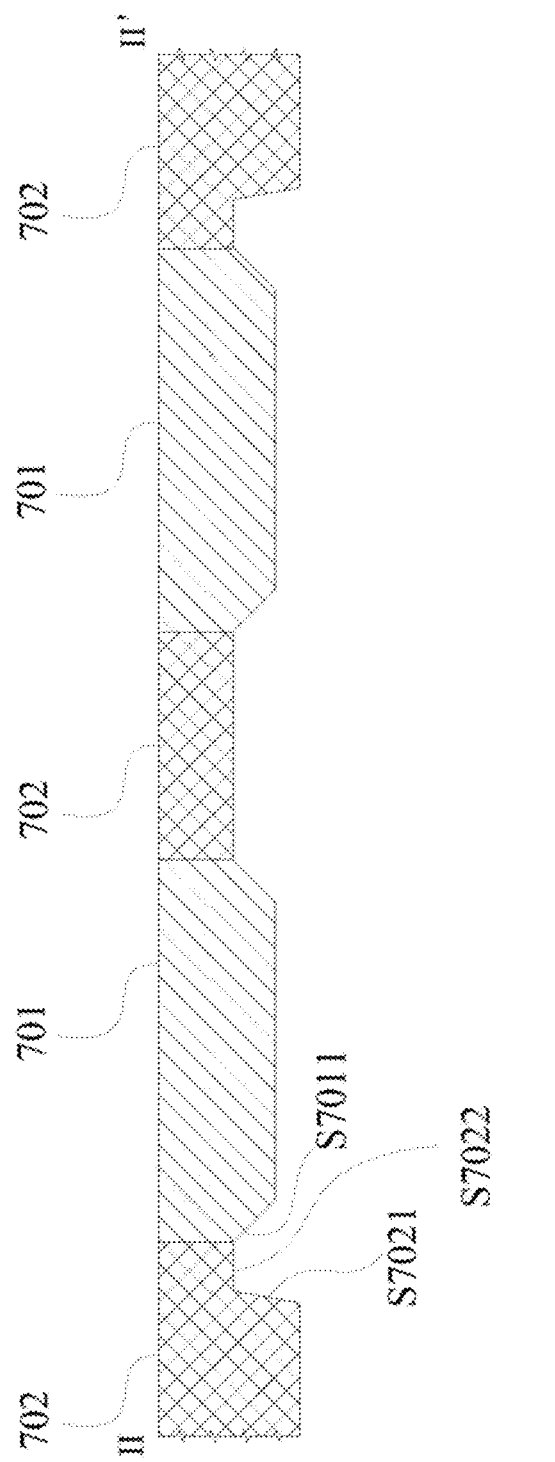
FIGS. 8-10 show sectional views of a molding mould taken along a line II-II' in FIG. 7 according to an embodiment of the present disclosure.

FIG. 7 shows a perspective view of a molding mould 700 according to an embodiment of the present disclosure. FIG. 8 shows a sectional view of the molding mould 700 taken along a line II-II' in FIG. 7 according to the embodiment of the present disclosure. Referring to FIGS. 7 and 8, the molding mould 700 may include a plurality of indenters 701 arranged in an array and a cavity-shaped portion 702 surrounding the plurality of indenters 701. The respective cavity-shaped portion 702 has a side surface S7021 and a flat top surface S7022, and the side surface S7021 and the top surface S7022 form an open space with the indenters 701. It should be noted that, for convenience of explanation, an upward direction of FIG. 7 is opposite to an upward direction of FIG. 8, that is, the open space in FIG. 7 faces upward, and the open space in FIG. 8 faces downward. In FIG. 8, a shape formed by the top surface S7022 and the side surface S7021 of the cavity-shaped portion 702 and the side surface S7011 of the indenter 701 together corresponds to a part of the molded portion 103 on the lamination side in FIG. 2. In some embodiments, the side surface S7011 of the indenter 701 is at an obtuse angle with the top surface S7022 of the cavity-shaped portion 702 for forming the inner side surface S1031 of the molded portion 103 at an obtuse angle with the top surface of the photosensitive element 102 shown in FIG. 2.

Figure 9:
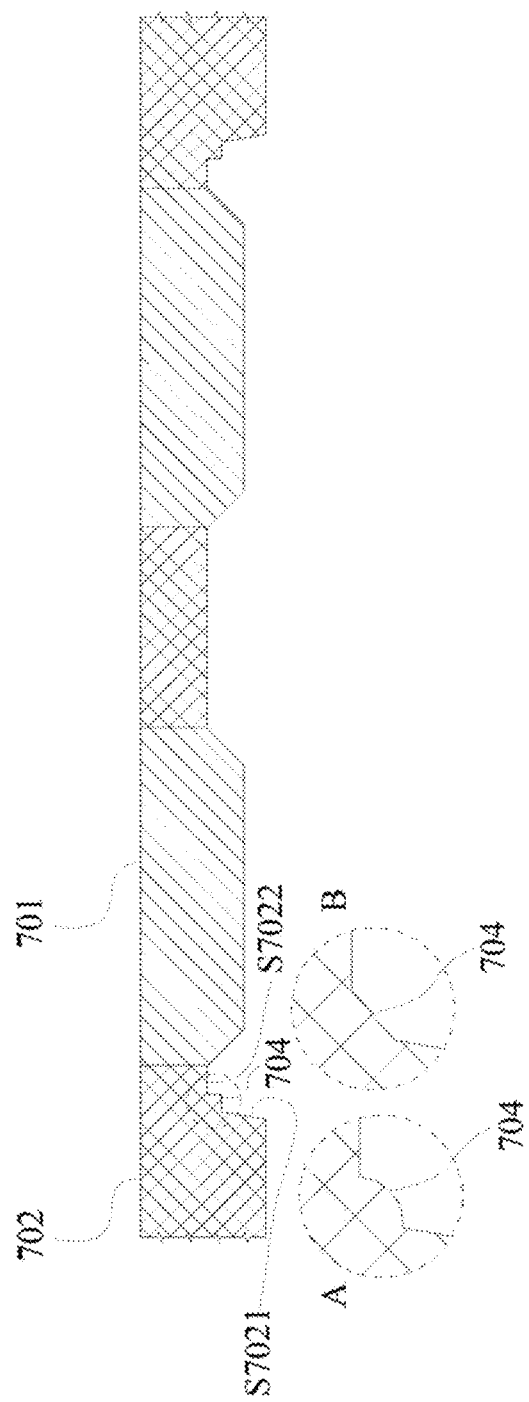

FIG. 9 shows a sectional view of the molding mould 700 taken along the line II-II' in FIG. 7 according to an embodiment of the present disclosure, and the sectional view is perpendicular to the top surface S7022 and the side surface S7021 of the cavity-shaped portion 702. Referring to FIG. 9, in this embodiment, the molding mould 700 has a protruded portion 704 located at an intersection between the top surface S7022 and the side surface S7021 of the cavity-shaped portion 702. As shown in FIG. 9, the sectional contour of the protruded portion 704 may have an arc shape, an oblique line shape, or a right angle shape, wherein in the sectional view including the indenter 701 and the cavity-shaped portion 702 in FIG. 9, the sectional contour of the protruded portion 704 is shown as a right angle shape, and the protruded portions 704 having a sectional contour of an arc shape and an oblique line shape are shown in the enlarged views A and B in a lower part of FIG. 9. The protruded portion 704 having the right angle shape is used to manufacture the recessed portion 110 shown in the enlarged view A of FIG. 4, and the protruded portions 704 having the sectional contours of the arc shape and the oblique line shape are used to manufacture the recessed portions 110 respectively shown in the enlarged views B and C of FIG. 4.

Figure 10:
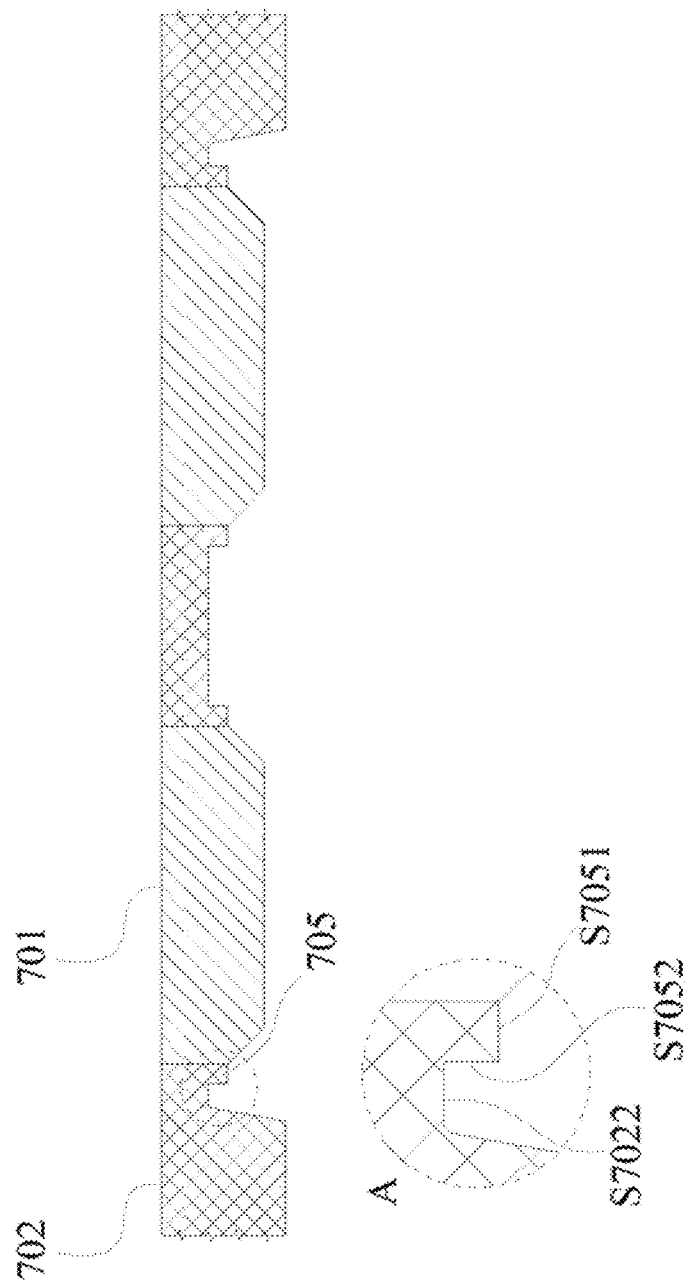

FIG. 10 shows a sectional view of the molding mould 700 taken along a line II-II' in FIG. 7 according to the embodiment of the present disclosure. Referring to FIG. 10, an enlarged view of the protruded portion 705 is shown in the enlarged view A of FIG. 10. The top surface S7022 of the cavity-shaped portion 702 includes a protruded portion 705 closest to the respective indenter 701. The protruded portion 705 has a bottom surface S7051 and a side surface S7052, wherein the bottom surface S7051 is parallel to the top surface S7022 of the cavity-shaped portion 702. The protruded portion 705 is used to form a recessed portion 111 shown in FIG. 5. Although only the protruded portions 705 are shown on two sides of the indenter 701 in the sectional view of FIG. 10, the protrusions 705 may surround the indenter 701.

A method for manufacturing the photosensitive assembly 100 will now be described in detail with reference to FIGS. 11-17.

Figure 11:
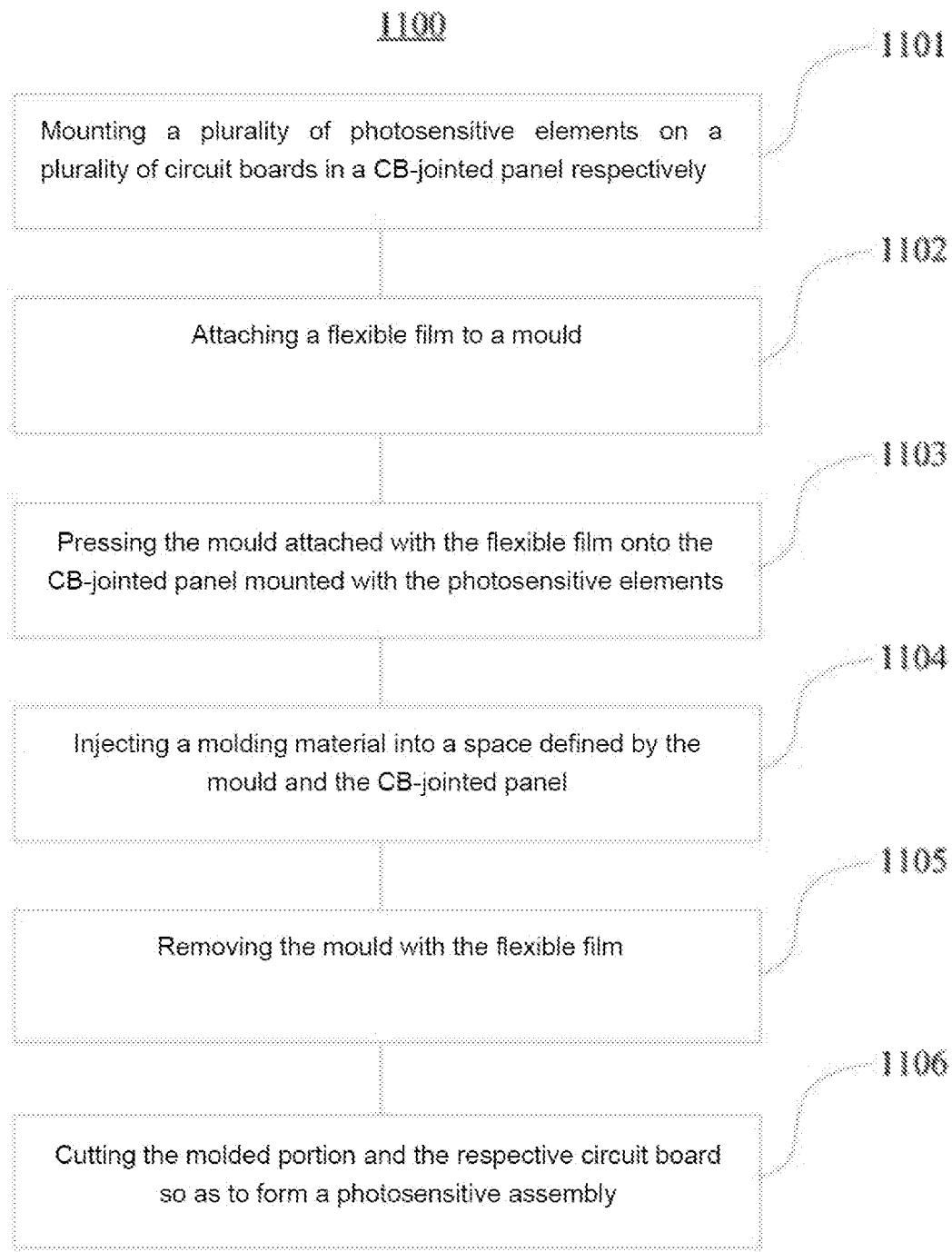
FIG. 11 shows a flowchart of a method for manufacturing a photosensitive assembly according to an embodiment of the present disclosure.

FIG. 11 shows a flowchart of a method 1100 for manufacturing the photosensitive assembly 100. As shown in FIG. 11, the method 1100 for manufacturing the photosensitive assembly 100 may include steps 1101-1106.

Figure 12:
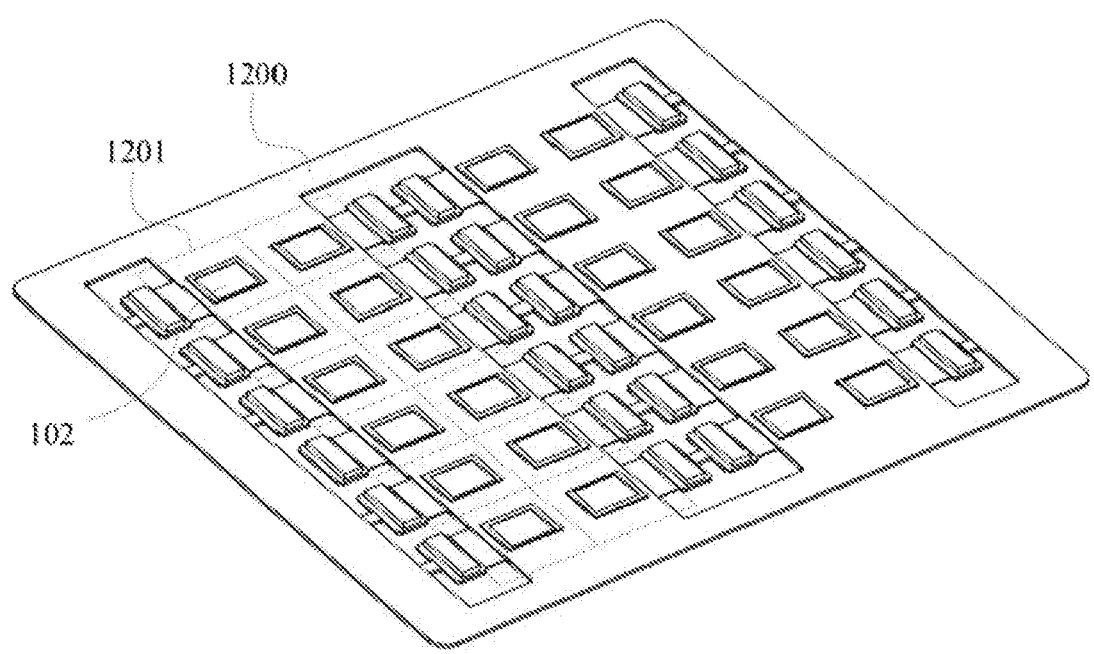
FIG. 12 shows a CB-jointed panel mounted with a plurality of circuit boards according to an embodiment of the present disclosure.

In step 1101, a plurality of photosensitive elements are mounted on a plurality of circuit boards in a CB-jointed panel, respectively. FIG. 12 shows a CB-jointed panel 1200 having a plurality of circuit boards 1201, wherein the circuit boards 1201 are arranged in an array and include rigid board regions 104 (see FIG. 3), the rigid board regions 104 have a lamination side and a non-lamination side, and a part of the circuit boards 1201 arranged in an array are shown by a dotted line in FIG. 12. In some embodiments, the circuit board 1201 may be a combined flexible and rigid board.

Figure 13:
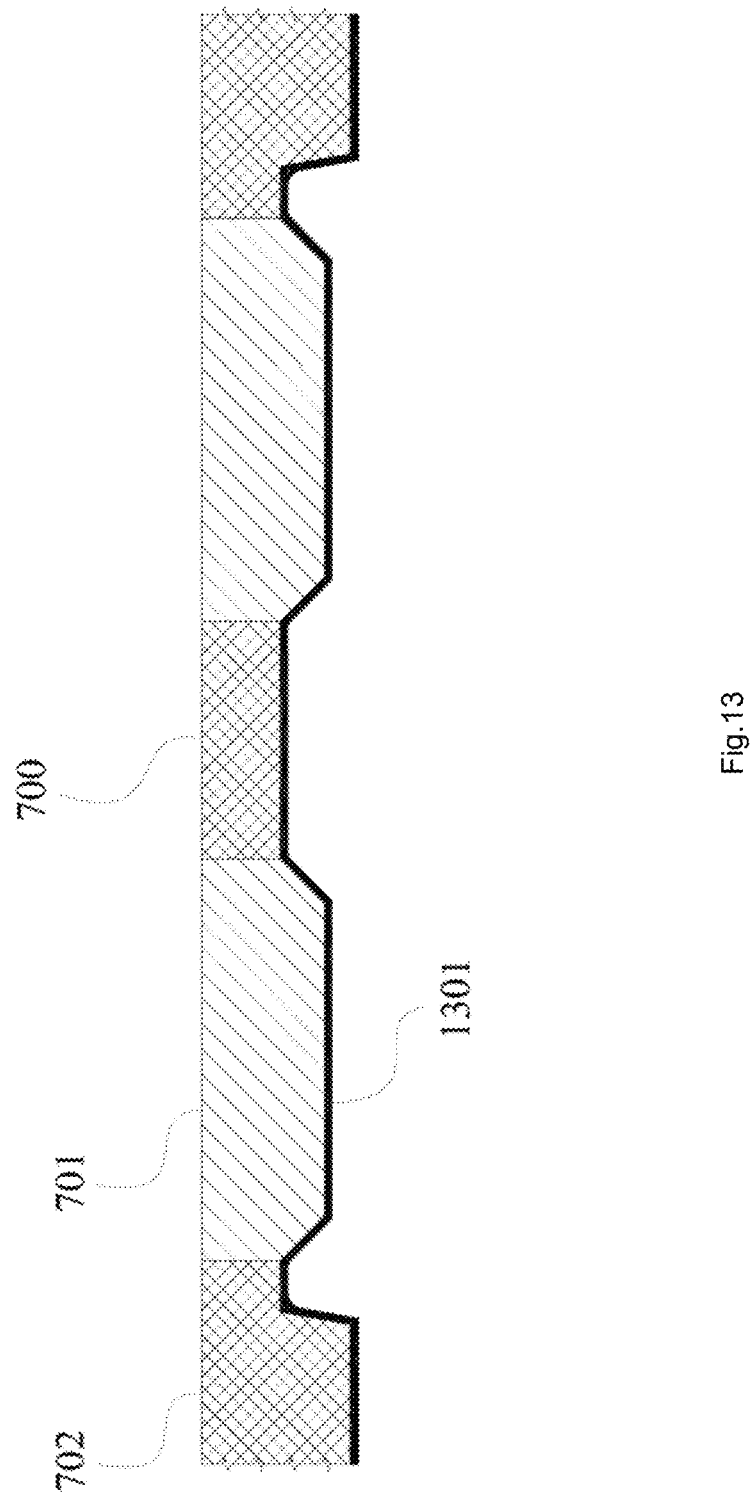
FIG. 13 shows a sectional view of a molding mould adsorbed and attached with a flexible film according to an embodiment of the present disclosure.

In step 1102, a flexible film is attached to a mould, wherein the mould may be the molding mould 700 described with reference to FIGS. 7-10. FIG. 13 shows a sectional view of a molding mould 700 having a flexible film 1301 adsorbed and attached thereon, and the sectional view may correspond to the sectional view of the molding mould 700 shown in FIG. 8. The flexible film 1301 can be attached to the molding mould 700 by means of vacuum adsorption. In this process, the gas between the flexible film 1301 and the mould 700 can be evacuated to form a vacuum, so that the flexible film 1301 is attached to the molding mould 700 and a shape corresponding to a bottom surface of the molding mould 700 is formed. Due to the elasticity of the flexible film 1301 itself, the flexible film 1301 at an intersection of the side surface S7021 and the top surface S7022 (see FIG. 8) of the cavity-shaped portion 702 may form a lower surface having an arc shape, which lower surface will form the aforementioned descending portion 107, and thus the descending portion 107 is formed, the flexible film 1301 at an intersection between the top surface S7022 of the cavity-shaped portion 702 and the side surface S7011 of the indenter 701 may also form a lower surface having an arc shape.

Figure 14:
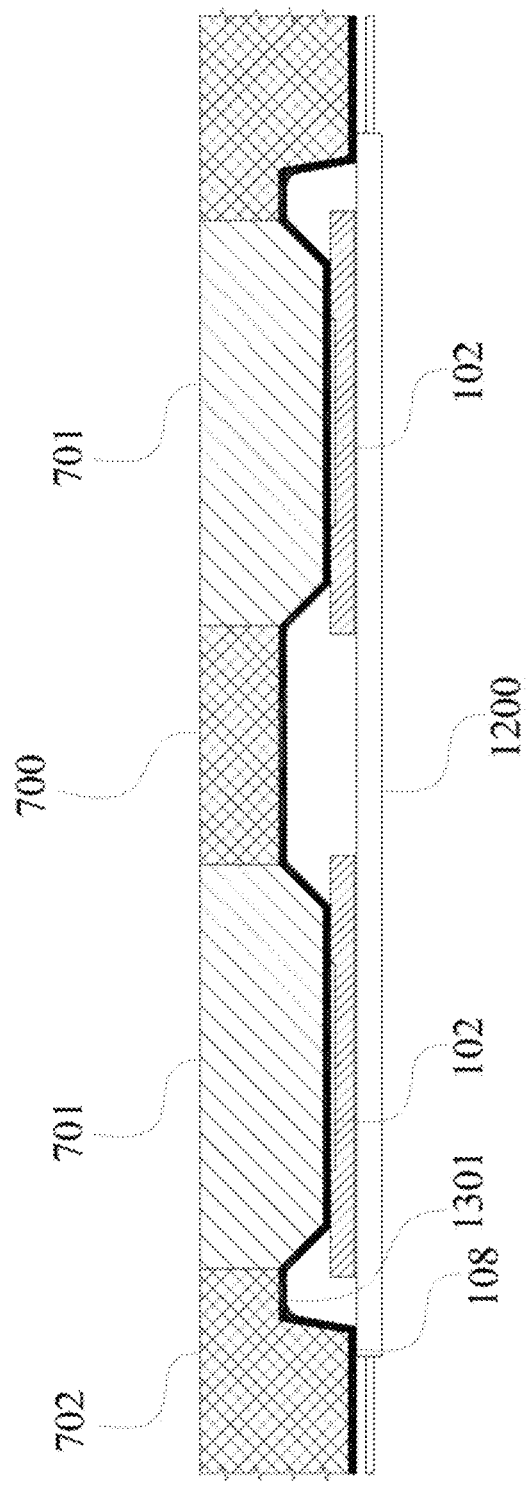
FIG. 14 shows a diagram of a CB-jointed panel and a molding mould after the mould is pressed on the CB-jointed panel according to an embodiment of the present disclosure.

In step 1103, the mould attached with the flexible film is pressed onto the CB-jointed panel mounted with the photosensitive elements, so that each indenter is aligned with each of a plurality of photosensitive elements, and the flexible film contacts the lamination region of each rigid board region. FIG. 14 shows a diagram of the CB-jointed panel 1200 and the molding mould 700 after step 1103 is performed. As shown in FIG. 14, a plurality of indenters 701 are separately aligned with the photosensitive elements 102, and the cavity-shaped portion 702 presses the flexible film 1301 at the lamination region 108, so that the flexible film 1301 contacts the lamination region 108, and the indenter 701 presses the flexible film 1301, so that the flexible film 1301 contacts the photosensitive element 102. Thus, a closed space is formed between the molding mould 700 attached with the flexible film 1301 and the CB-jointed panel 1200.

Figure 15:
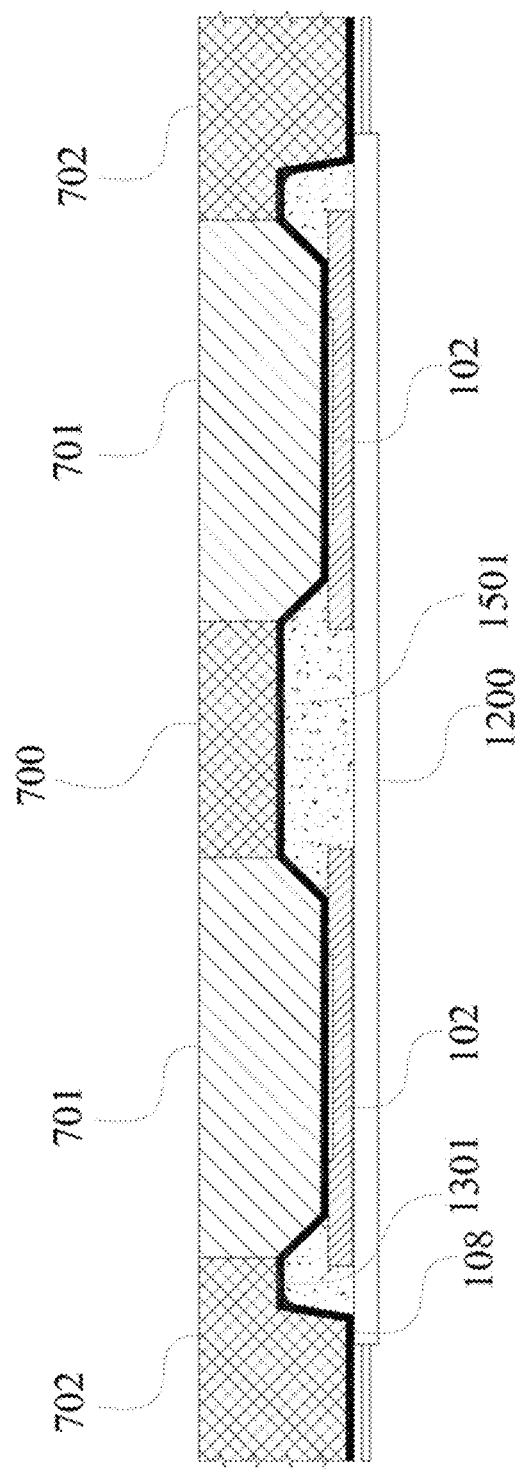
FIG. 15 shows a diagram of filling a molding material in a closed space between a mould and a CB-jointed panel according to an embodiment of the present disclosure.

In step 1104, a molding material is injected into a space defined by the mould attached with the flexible film and the CB-jointed panel mounted with a plurality of photosensitive elements so as to form a molded portion. FIG. 15 shows a diagram in which the molding material 1501 is filled into the above closed space, wherein the molding material 1501 has got a shape corresponding to the closed space.

Figure 16:
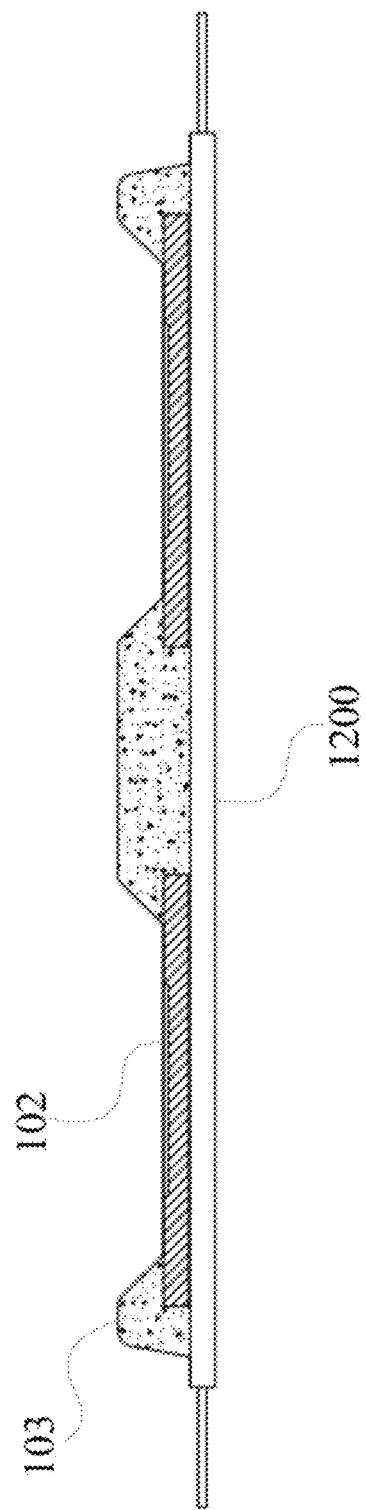
FIG. 16 shows a diagram of a photosensitive assembly after a mould and a flexible film are removed according to an embodiment of the present disclosure.

In step 1105, the mould is removed with the flexible film. FIG. 16 shows a diagram after the molding mould 700 and the flexible film 1301 are removed from the configuration shown in FIG. 15, wherein the molded portion 103 is formed on a CB-jointed panel 1200 mounted with the photosensitive elements 102.

Figure 17:
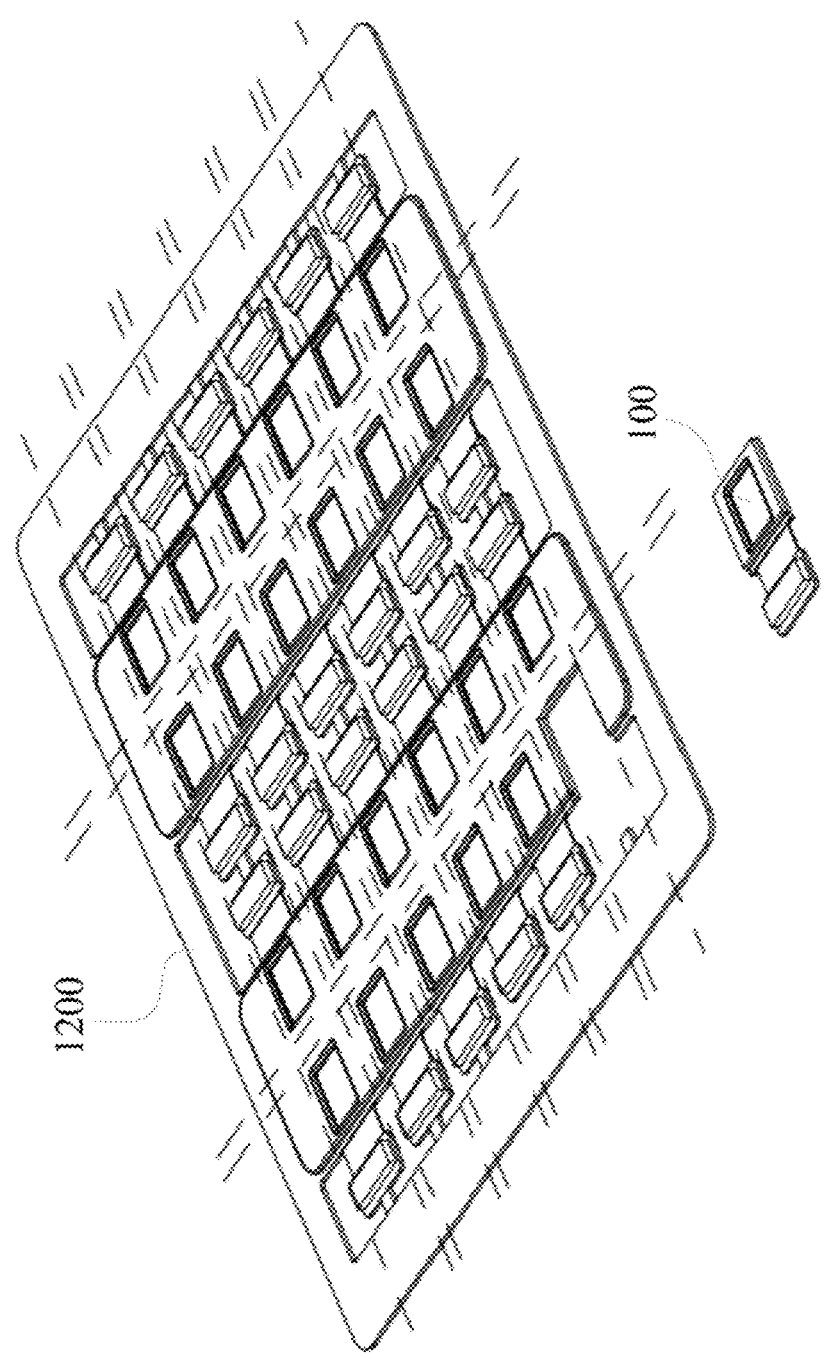
FIG. 17 shows a diagram of obtaining a single photosensitive assembly from a CB-jointed panel by means of cutting.

In step 1106, the photosensitive assembly is formed by cutting the molded portion at at least two non-lamination sides of each of the circuit boards and the respective circuit board along a direction perpendicular to a top surface of the CB-jointed panel. FIG. 17 shows a diagram of obtaining a single photosensitive assembly 100 from a CB-jointed panel by means of cutting. Referring to FIG. 17, a single photosensitive assembly 100 shown in a lower part of FIG. 17 is obtained by cutting the photosensitive assembly 100 perpendicularly to the top surface of the CB-jointed panel 1200 at three non-lamination sides of the photosensitive assembly 100 (i.e. three sides to which the flexible board extension portion is not connected). During the cutting process, the circuit board and the molded portion are cut at the same time. Thus, the resulting photosensitive assembly 100 has a flat portion 106 and an outer side surface S1032 perpendicular to each other on the non-lamination side(s) (see FIG. 2). In some embodiments, it is also possible to cut two sides of a photosensitive assembly 100, for example, when the photosensitive assembly 100 at any of the four corners of the CB-jointed panel is cut. As shown in FIG. 17, the flexible board extension portion of the photosensitive assembly 100 is connected to the outer frame of the CB-jointed panel 1200 through a narrow connecting portion, and on the non-lamination side(s) of the photosensitive assembly 100, the connecting portion of the photosensitive assembly 100 and an adjacent photosensitive assembly is wider than the narrow connecting portion, which is reasonable since in the molding process, in order to form the molded portion 103, a flow channel is required for the flow of the molding material, and the connecting portion between the photosensitive assemblies 100 functions as a flow channel.

The photosensitive assembly 100 formed by the method of the present disclosure is particularly suitable for a miniaturized imaging device. In the case where the molded portion at the lamination side has a descending portion, the area of the flat portion in this part is reduced, and in the miniaturized imaging device, the area of the flat portion for mounting the optical assembly is very valuable. The photosensitive assembly 100 according to the present disclosure makes the area of the flat portion maximized by making the outer side surface of the molded portion, on the non-lamination side(s), perpendicular to the flat portion. At the same time, the shape of the top surface formed by the descending portion, the flat portion and the connecting portion of the molded portion together makes the adhesive located thereon more inclined to flow towards the descending portion, which can prevent the adhesive from flowing towards a side of the photosensitive element and causing the photosensitive element to fail.

It should be understood that the exemplary embodiments described herein should be considered in a descriptive sense only and not for purposes of limitation. The description of features or aspects in each exemplary embodiment should generally be considered as available for other similar features or aspects in other exemplary embodiments.

Although certain exemplary embodiments and implementations have been described herein, other exemplary embodiments and modifications will be apparent from the description. Therefore, the concept of the present disclosure is not limited to these exemplary embodiments, but is defined by the appended claims with a broader scope and by various obvious modifications and equivalent arrangements.

The invention claimed is:

1. A photosensitive assembly, comprising:
   a circuit board having a rectangular-shaped rigid board region and comprising a flexible board extension portion extending from the rigid board region, wherein the rigid board region has a lamination side and a non-lamination side, the rigid board region has a lamination region on the lamination side, and the flexible board extension portion extends out from the lamination side;
   a photosensitive element mounted in the rigid board region of the circuit board; and
   a molded portion formed on the rigid board region, surrounding the photosensitive element, and extending towards the photosensitive element and coming into contact with the photosensitive element, wherein the molded portion has an inner side surface, an outer side surface and a top surface, the molded portion does not cover the lamination region of the rigid board region, and the top surface has a flat portion,
   wherein the top surface of a part of the molded portion on the lamination side has a descending portion, and the descending portion is located between the flat portion and the outer side surface of the molded portion and is lower than the flat portion,
   the outer side surface of a part of the molded portion on the non-lamination side is perpendicular to the flat portion, and
   wherein the descending portion, in a first section therethrough, has a contour of a first arc shape, wherein the first section is in a plane perpendicular to an edge of the rigid board region on the lamination side.

2. The photosensitive assembly according to claim 1, wherein the molded portion comprises a connecting portion connecting the inner side surface and the flat portion.

3. The photosensitive assembly according to claim 2, wherein the connecting portion, in a second section therethrough, has a contour of a second arc shape, wherein the second section is in a plane perpendicular to the flat portion adjacent to the connecting portion and the inner side surface, and a length of the first arc shape is greater than a length of the second arc shape.

4. The photosensitive assembly according to claim 2, wherein the connecting portion, in a second section therethrough, has a contour of a second arc shape, wherein the second section is in a plane perpendicular to the flat portion adjacent to the connecting portion and the inner side surface, and a radius of curvature of the first arc shape is greater than a radius of curvature of the second arc shape.

5. The photosensitive assembly according to claim 3, wherein the top surface of the molded portion has a recessed portion adjacent to the connecting portion, and the recessed portion, in a third section therethrough, has a contour of a right angle shape, and the right angle shape has a side parallel to the flat portion of the molded portion, wherein the third section is in a plane perpendicular to the inner side surface and the top surface of the molded portion.

6. The photosensitive assembly according to claim 1, wherein an outer side surface of the molded portion has a recessed portion adjacent to the descending portion, and the recessed portion, in a third section therethrough, has a contour of an arc shape, a right angle shape, or an oblique line shape, wherein the third section is in a plane perpendicular to an edge of the rigid board region on the lamination side.

7. The photosensitive assembly according to claim 1, wherein the molded portion has an opening exposing the photosensitive element.

8. The photosensitive assembly according to claim 1, wherein the inner side surface of the molded portion is at an obtuse angle with a top surface of the photosensitive element.

9. The photosensitive assembly according to claim 1, wherein the inner side surface of the molded portion is directly connected to a top surface of the photosensitive element.

10. An imaging module, comprising the photosensitive assembly according to claim 1 and an optical assembly mounted on the photosensitive assembly.

11. The imaging module according to claim 10, wherein the optical assembly is connected to the top surface of the molded portion by an adhesive, wherein the adhesive is present on the descending portion.

12. The imaging module according to claim 11, wherein the optical assembly comprises a lens assembly, and the lens assembly is connected to the flat portion of the top surface of the molded portion by an adhesive.

* * * * *